United States Patent
Lee et al.

(10) Patent No.: US 12,288,699 B2
(45) Date of Patent: Apr. 29, 2025

(54) SINGLE WAFER-TYPE WAFER CLEANING DEVICE AND METHOD FOR CONTROLLING SURFACE ROUGHNESS OF WAFER USING SAME

(71) Applicant: SK SILTRON CO., LTD., Gyeongsangbuk-do (KR)

(72) Inventors: Gun Ho Lee, Gyeongsangbuk-do (KR); Chi Bok Lee, Gyeongsangbuk-do (KR); Dae Ki Seo, Gyeongsangbuk-do (KR); Byeong Ha Ko, Gyeongsangbuk-do (KR)

(73) Assignee: SK SILTRON CO., LTD., Gyeongsangbuk-do (KR)

( * ) Notice: Subject to any disclaimer, the term of this patent is extended or adjusted under 35 U.S.C. 154(b) by 0 days.

(21) Appl. No.: 18/273,835

(22) PCT Filed: Feb. 16, 2021

(86) PCT No.: PCT/KR2021/001966
§ 371 (c)(1),
(2) Date: Jul. 24, 2023

(87) PCT Pub. No.: WO2022/163895
PCT Pub. Date: Aug. 4, 2022

(65) Prior Publication Data
US 2024/0304469 A1    Sep. 12, 2024

(30) Foreign Application Priority Data

Jan. 27, 2021 (KR) .................. 10-2021-0011542

(51) Int. Cl.
*B08B 3/02* (2006.01)
*H01L 21/02* (2006.01)
(Continued)

(52) U.S. Cl.
CPC .......... *H01L 21/67051* (2013.01); *B08B 3/02* (2013.01); *H01L 21/02052* (2013.01);
(Continued)

(58) Field of Classification Search
None
See application file for complete search history.

(56) References Cited

U.S. PATENT DOCUMENTS

2003/0168089 A1   9/2003   Katakabe et al.
2013/0034966 A1   2/2013   Yeh et al.

FOREIGN PATENT DOCUMENTS

EP       2113939         11/2009
JP       2008-159872      7/2008
(Continued)

OTHER PUBLICATIONS

Lee, "KR20120111794A English Machine Translation.pdf", Oct. 11, 2012—Machine translation from Espacenet.com.*
(Continued)

*Primary Examiner* — Levon J Shahinian
(74) *Attorney, Agent, or Firm* — KED & ASSOCIATES, LLP (57) ABSTRACT

The present invention presents a single wafer-type wafer cleaning device and a single wafer-type method for controlling the surface roughness of a wafer, in which, in a wafer cleaning process, mutually different cleaning processes are carried out on the respective two sides of a wafer, and also, mutually different chemicals are used depending on the side of the wafer being cleaned, thereby enabling the respective roughness of the two sides to differ. The single wafer-type wafer cleaning device comprises a spin chamber, a first chemical supply device, a second chemical supply device and a third chemical supply device.

4 Claims, 11 Drawing Sheets

(51) Int. Cl.
*H01L 21/67* (2006.01)
*H01L 21/687* (2006.01)

(52) U.S. Cl.
CPC .... *H01L 21/02057* (2013.01); *H01L 21/0209* (2013.01); *H01L 21/67288* (2013.01); *H01L 21/68764* (2013.01)

(56) References Cited

FOREIGN PATENT DOCUMENTS

| JP | 2016-115858 | 6/2016 |
| JP | 06-2014198 | 9/2017 |
| JP | 2001-053050 | 2/2023 |
| KR | 10-2003-0043739 | 6/2003 |
| KR | 10-2007-0003724 | 1/2007 |
| KR | 10-2012-0111794 | 10/2012 |
| KR | 10-2013-0032229 | 4/2013 |
| KR | 10-2020-0040538 | 4/2020 |

OTHER PUBLICATIONS

Japanese Office Action dated Aug. 6, 2024.
International Search Report dated Oct. 25, 2021 issued in Application No. PCT/KR2021/001966.
Korean Notice of Allowance dated Mar. 23, 2023 issued in Application No. 10-2021-0011542.
Extended European Search Report dated Mar. 3, 2025, issued in Application No. 21923327.7.

* cited by examiner

|  | O3 | Simultaneous supply of O3 and HF | (Repeat) |
|---|---|---|---|
| 1) Time | 1~5sec | 1~5sec | x 12 to 18 times |
| 2) Concentration | 5~20ppm | O3(5~20ppm) / HF(0.2~1.0wt%) | |
| 3) Flow rate | 0.5~1.5lpm | 0.5~1.5lpm | |
| 4) Spin rpm | 500~1500rpm | 500~1500rpm | |

|  | O3 | O3 | HF | (Repeat) |
|---|---|---|---|---|
| 1) Time | 1~5sec | 1~5sec | 1~5sec | x 12 to 18 times |
| 2) Concentration | 5~20ppm | 5~20ppm | 0.2~1.0wt% | |
| 3) Flow rate | 0.5~1.5lpm | 0.5~1.5lpm | 0.5~1.5lpm | |
| 4) Spin rpm | 500~1500rpm | 500~1500rpm | 500~1500rpm | |

|  | Simultaneous supply of O3 and HF |
|---|---|
| 1) Time | 6~120sec |
| 2) Concentration | O3(5~20ppm) / HF(0.2~1.0wt%) |
| 3) Flow rate | 0.5~1.5lpm |
| 4) Spin rpm | 500~1500rpm |

SINGLE WAFER-TYPE WAFER CLEANING DEVICE AND METHOD FOR CONTROLLING SURFACE ROUGHNESS OF WAFER USING SAME

CROSS-REFERENCE TO RELATED PATENT APPLICATIONS

This application is a U.S. National Stage Application under 35 U.S.C. § 371 of PCT Application No. PCT/KR2021/001966, filed Feb. 16, 2021, which claims priority to Korean Patent Application No. 10-2021-0011542, filed Jan. 27, 2021, whose entire disclosures are hereby incorporated by reference.

TECHNICAL FIELD

The present disclosure relates to a wafer cleaning apparatus, and more particularly to a single-wafer type wafer cleaning apparatus and a single-wafer type wafer surface roughness control method which enable a wafer to have different degrees of roughness at front and back sides thereof, respectively.

BACKGROUND ART

Technologies for cleaning a surface of a semiconductor wafer may be classified into a wet type and a dry type. Impurities such as slurry, particles or the like may attach to a surface of a semiconductor wafer which is being subjected to a manufacturing process. A cleaning process is similar to an etching process in that the cleaning process removes a material on the surface of the semiconductor wafer, but is different from the etching process in that a target to be removed is impurities.

The wet-type process may also be classified into a batch type and a spray type.

Figure 1:
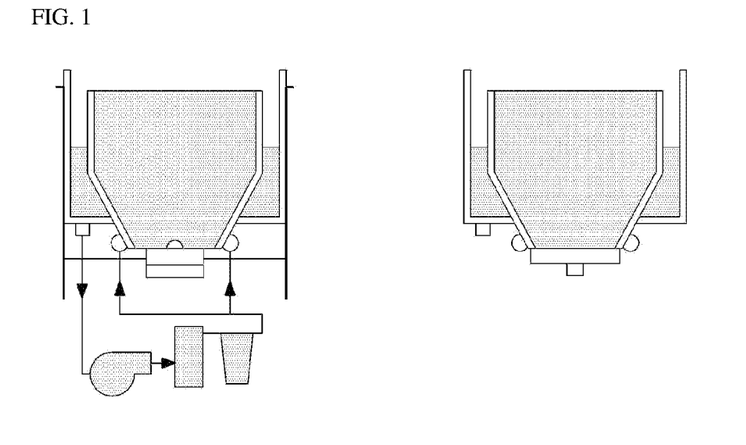
FIG. 1 explains an example of a conventional batch type cleaning process.

FIG. 1 explains an example of a conventional batch type cleaning process.

Referring to FIG. 1, the batch type process performs a cleaning procedure by primarily dipping a plurality of wafers in a left dip bath including a chemical, thereby removing impurities on both sides of each wafer, and then dipping the wafers in a right dip bath after removal of the impurities on the both sides of each wafer using the chemical, thereby additionally removing the impurities and the chemical remaining on the sides of each wafer.

The spray type process is a process for removing impurities on a wafer by spraying a chemical having the form of a liquid or a gas onto the wafer while rotating the wafer.

The batch type process has features in that the batch type process is advantageous in cleaning a large number of wafers at once, whereas the spray type process has features in that the spray type process is advantageous in cleaning wafers on a single-wafer basis. Although use of the batch type was given much weight in a batch dip type process in conventional cases, use of the spray type (single-wafer type) (referred to hereinafter as a "single-wafer type") has recently been given much weight in a batch dip type process in accordance with advances in micro processes and change in used materials.

In a procedure in which a back side of a wafer is seated on a process stage in a semiconductor manufacturing process, generation of impurity particles may frequently occur due to slippage of the wafer on a surface of the process stage. In this case, there may be a problem in that the generated impurity particles are transferred to a front side of the wafer on which a process is being performed.

Figure 2:
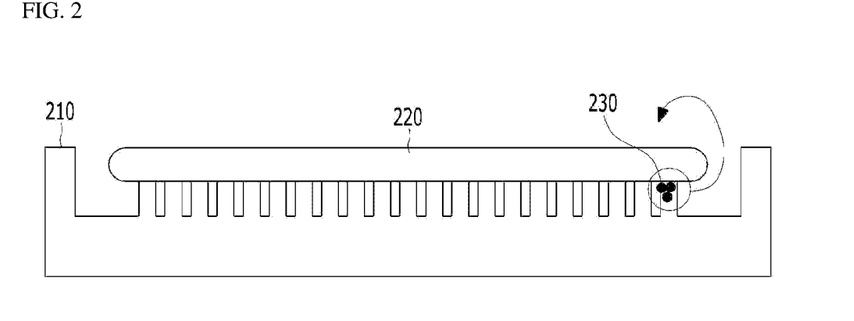
FIG. 2 explains slippage of a wafer generated on a process stage and particles generated during slippage.

FIG. 2 explains slippage of a wafer generated on a process stage and particles generated during slippage.

Referring to FIG. 2, it may be seen that, as a back side of a wafer 220 seated on a process stage 210 slips on an upper surface of the process stage 210, impurity particles 230 are generated, and the generated impurity particles 230 move to a front side of the wafer 220.

In order to solve the problem occurring during a semiconductor manufacturing process, as mentioned above with reference to FIG. 2, a method, in which a wafer has different degrees of surface roughness (u-roughness) at front and back sides thereof, respectively, thereby minimizing slippage thereof on a process stage, has been proposed and used.

Figure 3:
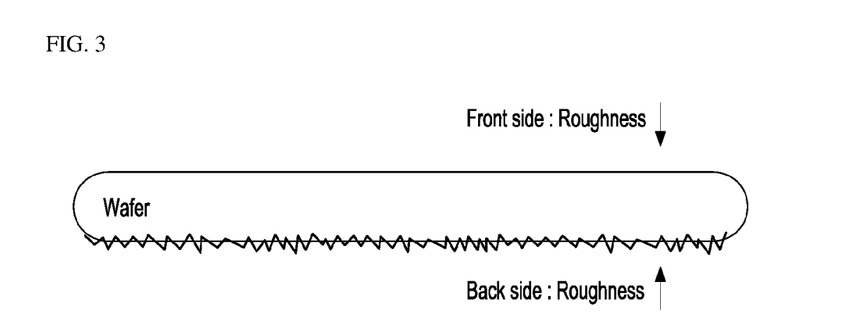
FIG. 3 explains an example of a wafer having different degrees of roughness at both sides thereof.

FIG. 3 explains an example of a wafer having different degrees of roughness at both sides thereof.

Referring to FIG. 3, it may be seen that surface roughness of a front side of a wafer, which is a target for a practical semiconductor manufacturing process, and surface roughness of a back side of the wafer are different from each other.

DISCLOSURE

Technical Problem

An object of the present disclosure to solve technical problems is to provide a single-wafer type wafer cleaning apparatus in which different cleaning processes are performed on both sides of a wafer in a procedure of cleaning the wafer, respectively, and chemicals respectively used for the sides of the wafer to be cleaned are different from each other, thereby enabling the wafer to have different degrees of roughness at the sides thereof, respectively.

Another object of the present disclosure to solve technical problems is to provide a single-wafer type wafer surface roughness control method in which different cleaning processes are performed on both sides of a wafer in a procedure of cleaning the wafer, respectively, and chemicals respectively used for the sides of the wafer to be cleaned are different from each other, thereby enabling the wafer to have different degrees of roughness at the sides thereof, respectively.

Technical Solution

In one aspect of the present disclosure for accomplishing the objects, provided herein is a single-wafer type wafer cleaning apparatus wherein a first chemical is supplied to a front side of a wafer seated on a rotating spindle table, to clean the front side of the wafer, and the first chemical and a second chemical different from the first chemical are supplied to a back side of the wafer, to clean the back side of the wafer, and the first chemical is ozonated wafer, and the second chemical is hydrogen fluoride.

In another aspect of the present disclosure, provided herein is a single-wafer type wafer cleaning apparatus including a spin chamber, a first chemical supplier, a second chemical supplier, and a third chemical supplier. The spin chamber is mounted therein with a spindle table configured to support a wafer seated thereon and to rotate during a cleaning process. The first chemical supplier is configured to supply a first chemical for cleaning to a front side of the wafer rotating during execution of the cleaning process. The second chemical supplier is configured to supply a second chemical for cleaning to a back side of the wafer rotating during execution of the cleaning process. The third chemical supplier is configured to supply a third chemical for cleaning to the back side of the wafer rotating during execution of the cleaning process. The first chemical for cleaning and the second chemical for cleaning are ozonated water, and the third chemical for cleaning is hydrogen fluoride.

In another aspect of the present disclosure, provided herein is a single-wafer type wafer surface roughness control method including spindle table rotation for rotating a spindle table supporting a wafer seated thereon, first chemical supply for supplying a first chemical for cleaning to a front side of the wafer rotating together with the spindle table, and simultaneous second and third chemical supply for supplying a second chemical for cleaning and a third chemical for cleaning to a back side of the wafer rotating together with the spindle table.

In another aspect of the present disclosure, provided herein is a single-wafer type wafer surface roughness control method including spindle table rotation for rotating a spindle table supporting a wafer seated thereon, first chemical supply for supplying a first chemical for cleaning to a front side of the wafer rotating together with the spindle table, and alternating second and third chemical supply for alternately supplying a second chemical for cleaning and a third chemical for cleaning to a back side of the wafer rotating together with the spindle table.

In another aspect of the present disclosure, provided herein is a single-wafer type wafer surface roughness control method including spindle table rotation for rotating a spindle table supporting a wafer seated thereon, and simultaneous first to third chemical supply for supplying a first chemical to a front side of the wafer rotating together with the spindle table, and, at the same time, supplying a second chemical and a third chemical to a back side of the wafer.

Advantageous Effects

As described above, in the single-wafer type wafer cleaning apparatus and the single-wafer type wafer surface roughness control method according to the present disclosure, there are advantages in that problems of generation of impurity particles caused by slippage of a wafer and transfer of the impurity particles to a front side of the wafer are minimized because it may be possible for a back side of the wafer to be rougher than the front side of the wafer through a method in which different chemicals for cleaning are used for the front side of the wafer and the back side of the wafer in a process of cleaning the wafer, respectively.

BEST MODE

For sufficient understanding of the present disclosure, advantages in operation of the present disclosure, and objects accomplished through implementation of the present disclosure, the accompanying drawings explaining exemplary embodiments of the present disclosure and the contents described with reference to the accompanying drawings should be referred to.

Hereinafter, the present disclosure will be described in detail through description of preferred embodiments of the present disclosure given with reference to the accompanying drawings. The same reference numerals in the drawings designate the same elements, respectively.

A core idea of the present disclosure is to selectively control surface roughness of an upper side (or a front side) of a wafer and surface roughness of a lower side (or a back side) of the wafer by performing cleaning of the front side of the wafer and cleaning of the back side of the wafer at different times, respectively, while using different cleaning agents for the front side of the wafer and the back side of the wafer upon cleaning the wafer, respectively. Through such a procedure, the surface roughness of the back side of the wafer may be greater than the surface roughness of the front side of the wafer.

For example, the surface roughness of the front side of the wafer is controlled using a first chemical, that is, ozonated ($O_3$) water, and the surface roughness of the back side of the wafer is controlled using a second chemical, that is, hydrogen fluoride (HF).

After a front side and a back side of a wafer were cleaned through a method proposed in the present disclosure, and roughness of the front side and roughness of the back side per 1 μm×1 μm were then compared with each other, experimental results that the surface roughness of the front side of the wafer using ozonated water is 0.9 to 1.0 Å, and the surface roughness of the back side of the wafer using ozonated water and hydrogen fluoride is 1.5 Å or more were obtained.

In particular, when the case in which ozonated water and hydrogen fluoride supplied to the back side of the wafer are simultaneously charged and the case in which the ozonated water and the hydrogen fluoride are charged at different times, respectively, are compared with each other, experimental results that the surface roughness of the back side of the wafer in the case in which the ozonated water and the hydrogen fluoride are simultaneously charged is greater than that in the case in which the ozonated water and the hydrogen fluoride are alternately charged (alternating charge) were obtained.

In addition, in the case in which ozonated water and hydrogen fluoride are alternately charged, it may be possible to implement an embodiment in which, when ozonated water is charged, charge of ozonated water is simultaneously performed for the front side of the wafer and the back side of the wafer, whereas, when hydrogen fluoride is charged, charge of hydrogen fluoride is performed only for the back side of the wafer, as well as the case in which a cleaning procedure for the front side of the wafer and a cleaning procedure for the back side of the wafer are independently performed, respectively.

Since the surface roughness of the front side of the wafer subjected to the above-described method is 0.9 to 1.0 Å, as apparent from the experimental results, advantages were also identified from the experimental results in that the thickness of a pad PAD is adjustable in a pad process.

The following description will be given based on the above-described experimental results.

Figure 4:
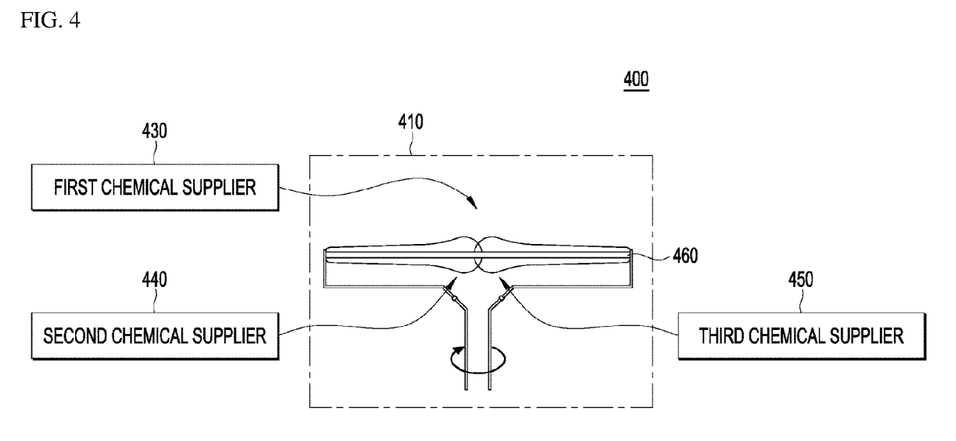
FIG. 4 explains a single-wafer type wafer cleaning apparatus according to an embodiment of the present disclosure.

FIG. 4 explains a single-wafer type wafer cleaning apparatus according to an embodiment of the present disclosure.

Referring to FIG. 4, a single-wafer type cleaning apparatus 400 according to an embodiment of the present disclosure includes a spin chamber 410, a spindle table 420, a first chemical supplier 430, a second chemical supplier 440, and a third chemical supplier 450.

The spin chamber 410 is mounted therein with the spindle table 420 configured to support a wafer 460 seated thereon and to rotate during a cleaning process. The spin chamber 410 maintains an interior thereof in a vacuum state during the cleaning process. The first chemical supplier 430 supplies a chemical I for cleaning to a front side of the wafer 460 rotating during execution of the cleaning process. The second chemical supplier 440 supplies a chemical II for cleaning to a back side of the wafer 460 rotating during execution of the cleaning process. The third chemical supplier 450 supplies a chemical III for cleaning to the back side of the wafer 460 rotating during execution of the cleaning process.

Although supply of the cleaning chemical I, supply of the cleaning chemical II, and supply of the cleaning chemical III may be performed at different times, respectively, in accordance with an embodiment, another embodiment in which the cleaning chemical I, the cleaning chemical II, and the cleaning chemical III are simultaneously supplied may also be possible.

In the present disclosure, use of ozone ($O_3$) or ozonated water as the cleaning chemical I and the cleaning chemical II, and use of hydrogen fluoride (HF) as the cleaning chemical III are proposed.

Figure 5:
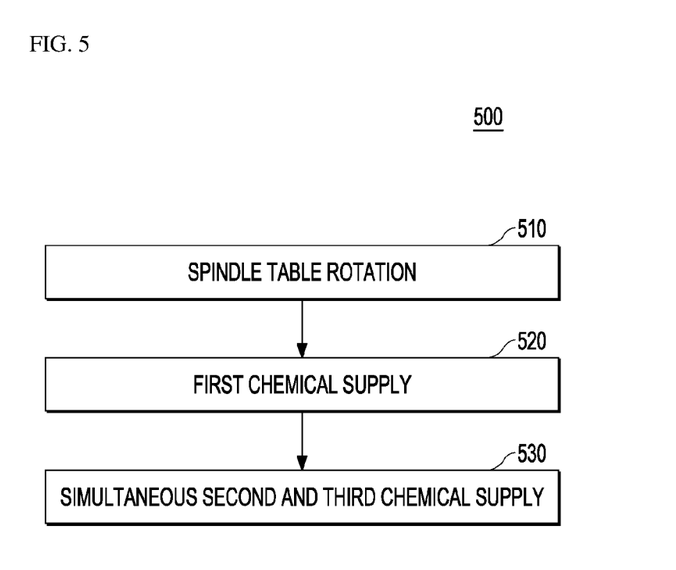
FIG. 5 shows a single-wafer type wafer surface roughness control method according to an embodiment of the present disclosure.

FIG. 5 shows a single-wafer type wafer surface roughness control method according to an embodiment of the present disclosure.

Referring to FIG. 5, a single-wafer type wafer surface roughness control method 500 according to an embodiment of the present disclosure includes spindle table rotation 510, first chemical supply 520, and simultaneous second and third chemical supply 530.

In the spindle table rotation 510, a spindle table, on which a wafer is seated, is rotated.

In the first chemical supply 520, a first chemical, that is, deionized ozonated water, which is a chemical I, is supplied to a front side of the wafer rotating together with the spindle table. In this case, no chemical for cleaning is supplied to a back side of the wafer.

In the simultaneous second and third chemical supply 530, a second chemical, that is, a chemical II for cleaning, and a third chemical, that is, a chemical III for cleaning, are supplied to the back side of the wafer rotating together with the spindle table. As described above, the cleaning chemical II and the cleaning chemical III are ozonated water and hydrogen fluoride, respectively. In this case, no chemical for cleaning is supplied to the front side of the wafer.

Any one of the first chemical supply 520 and the simultaneous second and third chemical supply 530 may be preferentially performed, so long as, when one side (for example, the front side) of the wafer is cleaned, the other side (for example, the back side) of the wafer is not subjected to a cleaning process.

Of course, in order to maximize cleaning effects, it is proposed to repeatedly perform the spindle table rotation 510, the first chemical supply 520, and the simultaneous second and third chemical supply 530 up to a maximum of 18 times.

Figure 6:
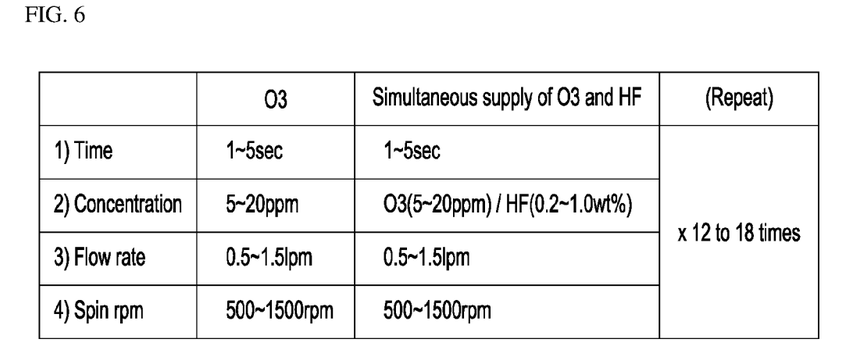
FIG. 6 explains examples of supply times, concentrations and flow rates of the supplied chemicals and a rotation speed of the spindle table in the single-wafer type wafer surface roughness control method according to the embodiment shown in FIG. 5.

FIG. 6 explains examples of supply times, concentrations and flow rates of the supplied chemicals and a rotation speed of the spindle table in the single-wafer type wafer surface roughness control method according to the embodiment shown in FIG. 5.

Referring to FIG. 6, it may be seen that ozonated water having a concentration of 5 to 20 parts per million (ppm) is supplied at a rate of 0.5 to 1.5 litter per minute (lpm) for 1 to 5 seconds to the front side of the wafer rotating at a speed of 500 to 1,500 revolutions per minute (rpm) in the first chemical supply 520 (a left side of FIG. 6), and ozonated water having a concentration of 5 to 20 ppm and hydrogen fluoride having a concentration of 0.2 to 1.0 wt % are supplied at a rate of 0.5 to 1.5 lpm for 1 to 5 seconds to the lower side of the wafer rotating at a speed of 500 to 1,500 rpm in the simultaneous second and third chemical supply 530, respectively, (a right side of FIG. 6).

As described above, it is preferred that the procedure of alternately cleaning the front side and the back side of the wafer be performed at least 12 times and up to a maximum of 18 times.

Figure 7:
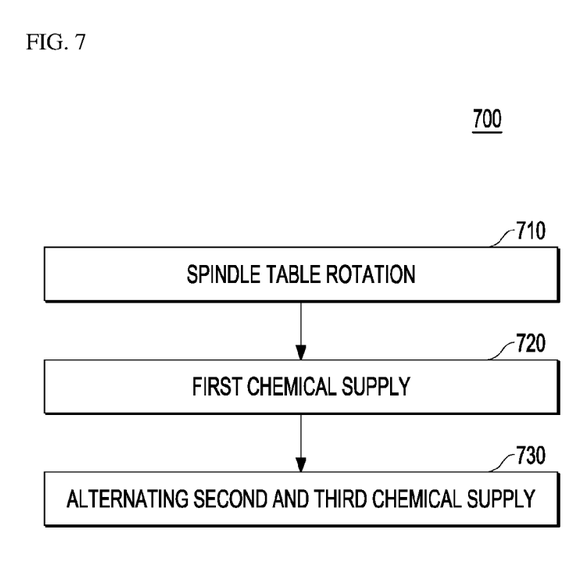
FIG. 7 shows a single-wafer type wafer surface roughness control method according to another embodiment of the present disclosure.

FIG. 7 shows a single-wafer type wafer surface roughness control method according to another embodiment of the present disclosure.

Referring to FIG. 7, a single-wafer type wafer surface roughness control method 700 according to another embodiment of the present disclosure includes spindle table rotation 710, first chemical supply 720, and alternating second and third chemical supply 730.

In the spindle table rotation 710, a spindle table, on which a wafer is seated, is rotated. In the first chemical supply 720, a first chemical is supplied to a front side of the wafer rotating together with the spindle table. In the alternating second and third chemical supply 730, a second chemical and a third chemical are alternately supplied to the back side of the wafer rotating together with the spindle table.

Although the single-wafer type wafer surface roughness control method 700 shown in FIG. 7 is identical to the single-wafer type wafer surface roughness control method 500 shown in FIG. 5 in that cleaning of the front side of the wafer and cleaning of the back side of the wafer are performed at different times, respectively, the single-wafer type wafer surface roughness control method 700 shown in FIG. 7 is different from the single-wafer type wafer surface roughness control method 500 shown in FIG. 5 in that the second chemical and the third chemical are alternately charged when the back side of the wafer is cleaned, without being simultaneously charged.

Figure 8:
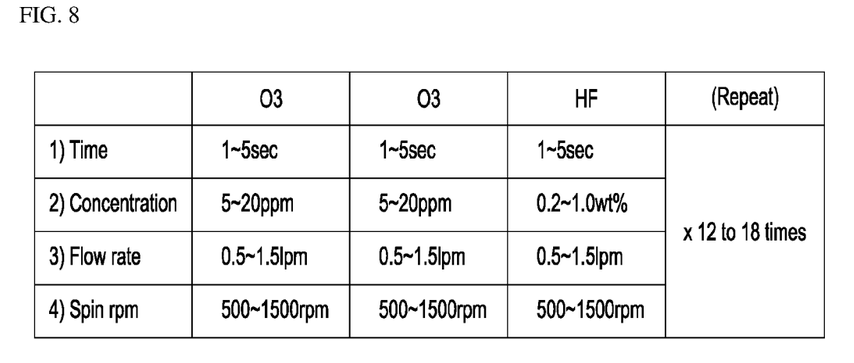
FIG. 8 explains examples of supply times, concentrations and flow rates of the supplied chemicals and a rotation speed of the spindle table in the single-wafer type wafer surface roughness control method according to the other embodiment shown in FIG. 7.

FIG. 8 explains examples of supply times, concentrations and flow rates of the supplied chemicals and a rotation speed of the spindle table in the single-wafer type wafer surface roughness control method according to the other embodiment shown in FIG. 7.

Referring to FIG. 8, in the first chemical supply 720, ozonated water having a concentration of 5 to 20 ppm is supplied at a rate of 0.5 to 1.5 lpm for 1 to 5 seconds to the front side of the wafer rotating at a speed of 500 to 1,500 rpm (a left side of FIG. 8). In the alternating second and third chemical supply 730, ozonated water having a concentration of 5 to 20 ppm and hydrogen fluoride having a concentration of 0.2 to 1.0 wt % are supplied at a rate of 0.5 to 1.5 lpm for 1 to 5 seconds to the back side of the wafer rotating at a speed of 500 to 1,500 rpm, respectively, (a right side of FIG. 8).

It is preferred that the procedure of alternately cleaning the front side and the back side of the wafer be performed at least 12 times and up to a maximum of 18 times.

Although the embodiment shown in FIG. 7 is identical to the embodiment shown in FIG. 5 in that cleaning of the front side of the wafer and cleaning of the back side of the wafer are performed at different times, respectively, the embodiment shown in FIG. 7 is different from the embodiment shown in FIG. 5 in that the second chemical and the third chemical are alternately used when the back side of the wafer is cleaned, without being simultaneously used.

Figure 9:
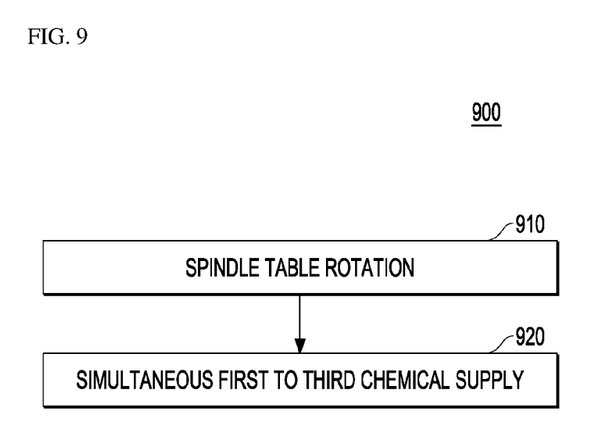
FIG. 9 shows a single-wafer type wafer surface roughness control method according to another embodiment of the present disclosure.

FIG. 9 shows a single-wafer type wafer surface roughness control method according to another embodiment of the present disclosure.

Referring to FIG. 9, a single-wafer type wafer surface roughness control method 900 according to another embodiment of the present disclosure includes spindle table rotation 910, and simultaneous first to third chemical supply 920.

In the spindle table rotation 910, a spindle table, on which a wafer is seated, is rotated.

In the simultaneous first to third chemical supply 920, a first chemical is supplied to a front side of the wafer rotating together with the spindle table, and, at the same time, a second chemical and a third chemical are supplied to a back side of the wafer.

Figure 10:
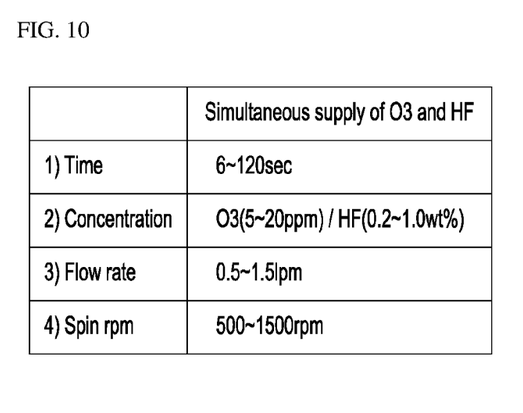
FIG. 10 explains examples of supply times, concentrations and flow rates of the supplied chemicals and a rotation speed of the spindle table in the single-wafer type wafer surface roughness control method according to the other embodiment shown in FIG. 9.

FIG. 10 explains examples of supply times, concentrations and flow rates of the supplied chemicals and a rotation speed of the spindle table in the single-wafer type wafer surface roughness control method according to the other embodiment shown in FIG. 9.

Referring to FIG. 10, in the simultaneous first to third chemical supply 920, ozonated water having a concentration of 5 to 20 ppm is supplied at a rate of 0.5 to 1.5 lpm for 6 to 120 seconds to the front side of the wafer rotating at a speed of 500 to 1,500 rpm.

It may be seen that the embodiment of FIG. 9 is different from the embodiments of FIGS. 5 and 7 in that cleaning is completed through a cleaning procedure performed once for 6 to 120 seconds.

Figure 11:
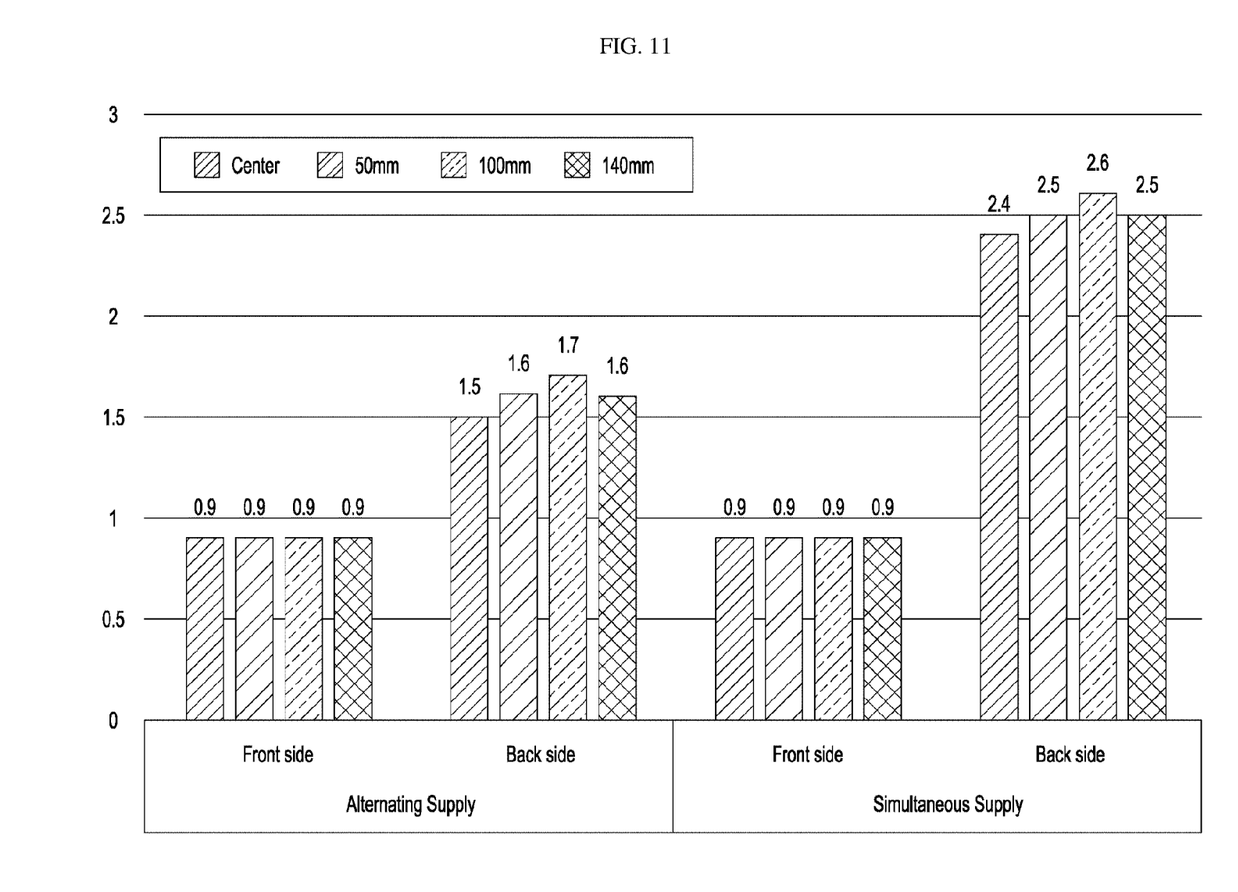
FIG. 11 shows degrees of roughness of opposite sides of a wafer exhibited when the opposite sides, that is, front and back sides, of the wafer are cleaned at the same time or at different times, respectively.

FIG. 11 shows degrees of roughness of opposite sides of a wafer exhibited when the opposite sides, that is, front and back sides, of the wafer are cleaned at the same time or at different times, respectively.

Referring to FIG. 11, results obtained in the embodiments of FIGS. 5 to 7 are shown. These results are obtained by measuring roughness at each center of the front and back sides of the wafer and a point spaced apart from the center by a predetermined distance.

It may be seen that, although examples of simultaneous supply and alternating supply exhibit the same roughness at the front side of the wafer, that is, about 0.9 angstrom (Å), the roughness at the back side of the wafer in the example of simultaneous supply is greater than the roughness at the back side of the wafer in the example of alternating supply by about 0.9 Å.

It may also be seen that the surface roughness at the back side of the wafer according to alternating supply shown at a left side of FIG. 11 is 1.5 Å at a center of the back side while being 1.6 Å, 1.7 Å, and 1.6 Å at points spaced apart from the center by 50 mm, 100 mm, and 140 mm, respectively, and, as such, being 1.5 Å or more at all of the points.

It may also be seen that the surface roughness at the back side of the wafer according to alternating supply shown at a right side of FIG. 11 is 2.4 Å at the center of the back side while being 2.5 Å, 2.6 Å, and 2.5 Å at the points spaced apart from the center by 50 mm, 100 mm, and 140 mm, respectively, and, as such, being 2.4 Å or more at all of the points.

Through comparison of the left side of FIG. 11 (the example of alternating supply) and the right side of FIG. 11 (the example of simultaneous supply), it may be seen that the roughness at the back side of the wafer is considerably greater than the roughness at the front side of the wafer in the case in which the second chemical and the third chemical, that is, ozone and hydrogen fluoride, are simultaneously supplied to the back side of the wafer, as compared to the case in which ozone and hydrogen are alternately supplied to the back side of the wafer.

Consequently, it may be seen that, when different cleaning chemicals are used for the front side of the wafer and the back side of the wafer, respectively, roughness of the back-side of the wafer is greater than roughness of the front side of the wafer in both cases, that is, the case in which cleaning is performed in an alternating supply manner and the case in which cleaning is performed in a simultaneous supply manner.

Thus, it may be possible to fabricate the back side of the wafer to be rougher than the front side of the wafer by cleaning the front side and the back side of the wafer in the manner according to the present disclosure. Accordingly, it may be possible to minimize slippage of the wafer when the wafer is seated on a stage in a subsequent process and, as such, to minimize generation of impurity particles caused by slippage of the wafer in conventional cases.

In batch type cleaning, use of which is given much weight in conventional cases, it is impossible for the front side and back side of the wafer to have different degrees of roughness, respectively. Furthermore, control of the degree of roughness is also difficult.

INDUSTRIAL APPLICABILITY

The present disclosure relates to a wafer cleaning apparatus, and may solve a problem that impurity particles are transferred to a front side of a wafer in a process of manufacturing the wafer and, as such, may achieve an enhancement in manufacture yield in the semiconductor industry.

The invention claimed is:
1. A single-wafer type wafer cleaning apparatus comprising:
a spin chamber mounted therein with a spindle table configured to support a wafer seated thereon and to rotate during a cleaning process;

a first chemical supplier configured to supply a first chemical for cleaning to a front side of the wafer rotating during execution of the cleaning process;

a second chemical supplier configured to supply a second chemical for cleaning to a back side of the wafer rotating during execution of the cleaning process; and a third chemical supplier configured to supply a third chemical for cleaning to the back side of the wafer rotating during execution of the cleaning process, wherein the first chemical for cleaning and the second chemical for cleaning are ozonated water, and the third chemical for cleaning is hydrogen fluoride, wherein:

the second chemical supplier and the third chemical supplier do not supply the second chemical for cleaning and the third chemical for cleaning to the back side of the wafer when the first chemical supplier supplies the first chemical for cleaning to the front side of the wafer; and the first chemical supplier does not supply the first chemical for cleaning to the front side of the wafer when the second chemical supplier and the third chemical supplier supply the second chemical for cleaning and the third chemical for cleaning to the back side of the wafer.

2. The single-wafer type wafer cleaning apparatus according to claim 1, wherein, when the second chemical supplier and the third chemical supplier supply the second chemical for cleaning and the third chemical for cleaning to the back side of the wafer, the second chemical for cleaning and the third chemical for cleaning are simultaneously supplied to the back side of the wafer.

3. The single-wafer type wafer cleaning apparatus according to claim 1, wherein, when the second chemical supplier and the third chemical supplier supply the second chemical for cleaning and the third chemical for cleaning to the back side of the wafer, the second chemical for cleaning and the third chemical for cleaning are alternately supplied to the back side of the wafer.

4. The single-wafer type wafer cleaning apparatus according to claim 1, wherein the first chemical for cleaning is supplied to the front side of the wafer, and, at a same time, the second chemical for cleaning and the third chemical for cleaning are supplied to the back side of the wafer.

* * * * *